US010209541B2

(12) United States Patent
Kim et al.

(10) Patent No.: US 10,209,541 B2
(45) Date of Patent: Feb. 19, 2019

(54) LIQUID CRYSTAL DISPLAY DEVICE AND METHOD FOR MANUFACTURING THE SAME

(71) Applicant: SAMSUNG DISPLAY CO., LTD., Yongin, Gyeonggi-do (KR)

(72) Inventors: Kyeong Jong Kim, Suwon-si (KR); Ki Chul Shin, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/069,204

(22) Filed: Mar. 14, 2016

(65) Prior Publication Data

US 2017/0068122 A1 Mar. 9, 2017

(30) Foreign Application Priority Data

Sep. 7, 2015 (KR) .......................... 10-2015-0126215

(51) Int. Cl.
*G02F 1/133* (2006.01)
*G02F 1/1368* (2006.01)
(Continued)

(52) U.S. Cl.
CPC ........ *G02F 1/13306* (2013.01); *G02F 1/1368* (2013.01); *G02F 1/13439* (2013.01); *G02F 1/13624* (2013.01); *G02F 1/136286* (2013.01); *H01L 27/124* (2013.01); *H01L 27/1222* (2013.01); *H01L 27/1251* (2013.01); *H01L 27/1288* (2013.01); *H01L 29/78669* (2013.01); *H01L 29/78678* (2013.01); *G02F 2001/136222* (2013.01); *G02F 2202/103* (2013.01);
(Continued)

(58) Field of Classification Search
CPC .................... G02F 1/13439; G02F 1/13306
USPC ............................. 257/59; 438/30
See application file for complete search history.

(56) References Cited

U.S. PATENT DOCUMENTS 8,810,745 B2 8/2014 Kim et al.
2005/0077524 A1* 4/2005 Ahn .................... G02F 1/13458
257/72
(Continued)

FOREIGN PATENT DOCUMENTS

KR 1020100100228 A 9/2010

OTHER PUBLICATIONS

D. L. Staebler, et al., "Optically induced conductivity changes in dischargeproduced hydrogenated amorphous silicon", J. Appl. Phys., vol. 51, No. 6, (Jun. 1980), pp. 3262-3268.

*Primary Examiner* — Igwe U Anya
(74) *Attorney, Agent, or Firm* — Cantor Colburn LLP

(57) ABSTRACT

A liquid crystal display device includes a data driving unit connected to a first data line disposed in a first direction, a gate driving unit connected to a first gate line disposed in a second direction, a first subpixel unit including a first switching element, a gate electrode of which is connected to the first gate line, one electrode of which is connected to the first data line and the other electrode of which is connected to a first subpixel electrode, and a second subpixel unit including a second switching element, a gate electrode of which is connected to the first gate line, one electrode of which is connected to the first data line and the other electrode of which is connected to a second subpixel electrode, wherein an on-resistance value of the second switching element is larger than an on-resistance value of the first switching element.

20 Claims, 11 Drawing Sheets

(51) Int. Cl.
*G02F 1/1362* (2006.01)
*G02F 1/1343* (2006.01)
*H01L 29/786* (2006.01)
*H01L 27/12* (2006.01)
*G09G 3/36* (2006.01)

(52) U.S. Cl.
CPC ..... *G02F 2202/104* (2013.01); *G09G 3/3688* (2013.01); *G09G 2300/0426* (2013.01); *G09G 2300/0465* (2013.01); *G09G 2310/08* (2013.01); *G09G 2320/0673* (2013.01)

(56) References Cited

U.S. PATENT DOCUMENTS

| | | | | |
|---|---|---|---|---|
| 2006/0119756 A1* | 6/2006 | Shin | .................... | G02F 1/13624 349/38 |
| 2008/0284929 A1* | 11/2008 | Kimura | ............... | G02F 1/13624 349/38 |
| 2009/0310047 A1* | 12/2009 | Shin | ..................... | G09G 3/3659 349/37 |
| 2009/0310048 A1* | 12/2009 | Shin | .................. | G02F 1/136286 349/38 |
| 2010/0157185 A1* | 6/2010 | Kim | ..................... | G02F 1/1362 349/38 |
| 2010/0225831 A1* | 9/2010 | Takeuchi | .......... | G02F 1/136213 348/739 |
| 2011/0006191 A1* | 1/2011 | Watanabe | ............ | H04N 5/232 250/208.1 |
| 2011/0079780 A1* | 4/2011 | Yamayoshi | ....... | H01L 21/02532 257/57 |
| 2011/0261028 A1* | 10/2011 | Goh | ..................... | G09G 3/3648 345/204 |
| 2011/0285930 A1* | 11/2011 | Kimura | ................ | G09G 3/3648 349/43 |
| 2013/0182018 A1* | 7/2013 | Jeong | .................. | G09G 3/3659 345/690 |
| 2017/0261801 A1* | 9/2017 | Li | ....................... | G02F 1/13624 |

\* cited by examiner

LIQUID CRYSTAL DISPLAY DEVICE AND METHOD FOR MANUFACTURING THE SAME

This application claims priority to Korean Patent Application No. 10-2015-0126215, filed on Sep. 7, 2015, and all the benefits accruing therefrom under 35 U.S.C. § 119, the content of which in its entirety is herein incorporated by reference.

BACKGROUND

1. Field

Exemplary embodiments of the invention relate to a liquid crystal display device and a method for manufacturing the same.

2. Description of the Related Art

The importance of display devices is increasing along with the development of multimedia. Accordingly, various kinds of display devices such as liquid crystal displays ("LCDs"), organic light emitting displays ("OLEDs") and the like are being used.

An LCD among such display devices is presently one of most widely used flat panel display devices, and includes two sheets of substrate having electric field generating electrodes such as pixel electrodes, a common electrode and the like formed thereon, and a liquid crystal layer interposed between the substrates. An LCD is configured in that a voltage is applied to the electric field generating electrodes so as to generate an electric field in the liquid crystal layer, which thus determines the orientation of liquid crystal molecules of the liquid crystal layer and controls the polarization of incident light, thereby displaying desired images.

Among LCD devices, a vertically aligned mode LCD device is being developed in which major axes of the liquid crystal molecules are aligned vertically relative to respective display panels in the absence of electric field. The vertically aligned mode LCD device is being developed into various structures including a structure in which one pixel is divided into two subpixels in order to secure side visibility.

SUMMARY

An exemplary embodiment of the invention provides a liquid crystal display ("LCD") device in which voltages having different levels are applied to two subpixel electrodes so as to improve side visibility, and a method for manufacturing the LCD device.

Another embodiment of the invention provides an LCD device in which a resistance component of a switching element varies to improve side visibility without employing a separate transistor for voltage division and a contact hole connected to the transistor, and a method for manufacturing the LCD device.

The LCD device of the invention is advantageous in that voltages having different levels are applied respectively to two subpixel electrodes included in one pixel unit, thereby improving side visibility.

Furthermore, the LCD device does not include a separate transistor for voltage division, and a contact hole connected to the transistor is not defined in the LCD device, thereby narrowing the distance between two subpixel electrodes and thus improving aperture ratio and transmittance.

An exemplary embodiment of the invention discloses a data driving unit connected to a first data line disposed in a first direction, a gate driving unit connected to a first gate line disposed in a second direction different from the first direction, a first subpixel unit including a first switching element, a gate electrode of which is connected to the first gate line, one electrode of which is connected to the first data line and the other electrode of which is connected to a first subpixel electrode and a second subpixel unit including a second switching element, a gate electrode of which is connected to the first gate line, one electrode of which is connected to the first data line and the other electrode of which is connected to a second subpixel electrode. An on-resistance value of the second switching element is larger than an on-resistance value of the first switching element.

An exemplary embodiment of the invention also discloses a first gate line disposed on a substrate, a first data line disposed on the substrate so as to be insulated from the first gate line, a first switching element including a first gate electrode connected to the first gate line, a first semiconductor pattern overlapping the first gate electrode, a first source electrode connected to the first data line, and a first drain electrode connected to a first subpixel electrode and a second switching element including a second gate electrode connected to the first gate line, a second semiconductor pattern overlapping the second gate electrode, a second source electrode connected to the first data line, and a second drain electrode connected to a second subpixel electrode. A resistance value of the second semiconductor pattern is higher than a resistance value of the first semiconductor pattern.

An exemplary embodiment of the invention also discloses providing a substrate on which a first gate line covered by a gate insulation layer is disposed, forming a first switching element including a first gate electrode connected to the first gate line and a first semiconductor pattern disposed on the gate insulation layer, and a second switching element including a second gate electrode connected to the first gate line and a second semiconductor pattern disposed on the gate insulation layer and forming a first subpixel electrode connected to a first drain electrode of the first switching element, and a second subpixel electrode connected to a second drain electrode of the second switching element, wherein forming the first and second switching elements includes: forming a semiconductor layer on the gate insulation layer, irradiating light to a region of the semiconductor layer corresponding to the second semiconductor pattern and forming a first data conductor on the semiconductor layer, and forming the first and second semiconductor patterns and the first and second drain electrodes by using the first data conductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention, and are incorporated in and constitute a part of this specification, illustrate exemplary embodiments of the invention, and, together with the description, serve to explain principles of the invention.

DETAILED DESCRIPTION

Figure 1:
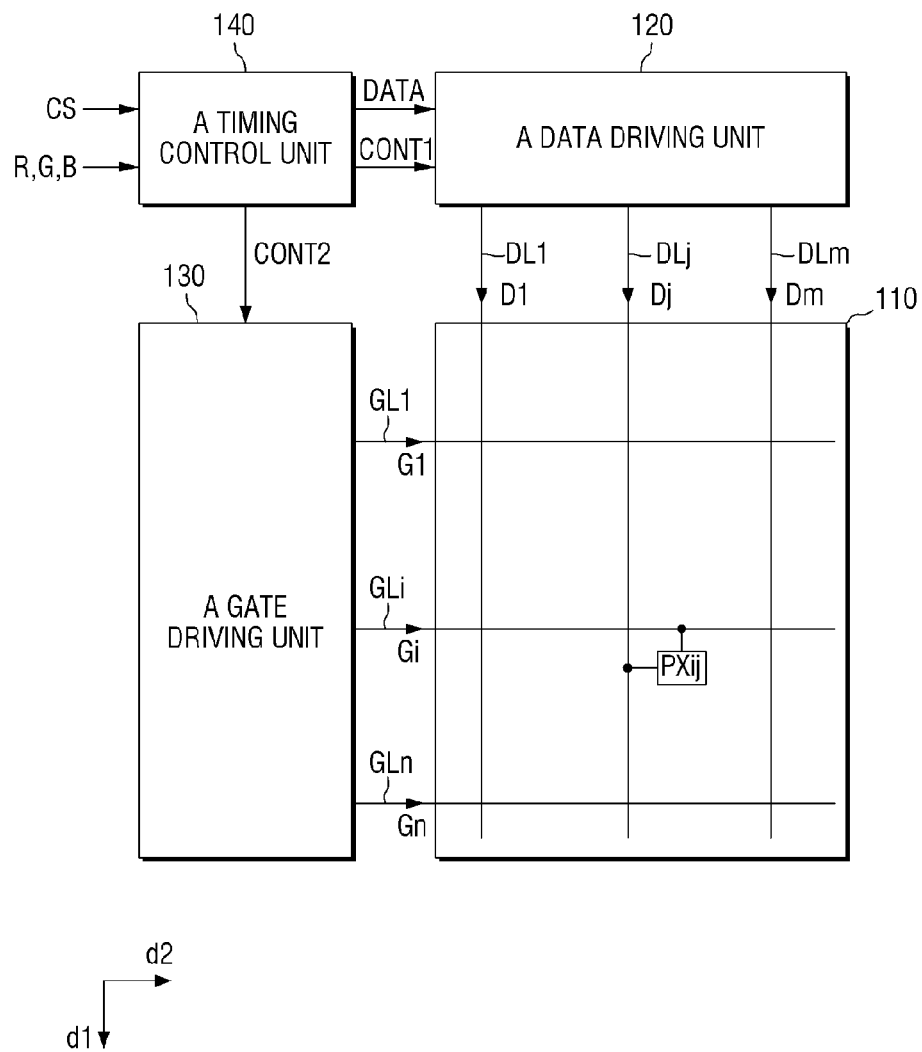
FIG. 1 schematically illustrates a liquid crystal display ("LCD") device according to an exemplary embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 schematically illustrates a liquid crystal display ("LCD") device according to an exemplary embodiment of the invention.

Referring to FIG. 1, the LCD device according to an exemplary embodiment of the invention may include a display panel 110, a data driving unit 120, a gate driving unit 130 and a timing control unit 140.

The display panel 110 may display an image. The display panel 110 may include a lower display plate 10 (refer to FIG. 4), an upper display plate 20 (refer to FIG. 4) facing the lower display plate 10, and a liquid crystal layer 30 (refer to FIG. 4) interposed therebetween. That is, the display panel 110 may be a liquid crystal panel. The display panel 110 may be connected to a plurality of gate lines GL1 to GLn and a plurality of data lines DL1 to DLm. In addition, the display panel 110 may include a plurality of pixel units connected to one of the plurality of gate lines GL1 to GLn and one of the plurality of data lines DL1 to DLm. FIG. 1 illustrates only pixel unit PXij, as a representative, connected to an ith gate line GLi and a jth data line DLj, and the description will be made on the pixel unit PXij throughout. The plurality of gate lines GL1 to GLn, the plurality of data lines DL1 to DLm, and the plurality of pixel units may be included in the lower display plate 10 of the display panel 110, and the lines may be insulated from each other.

As an exemplary embodiment, the plurality of pixel units may be arranged into a matrix. As an exemplary embodiment, the plurality of data lines DL1 to DLm may extend in a first direction d1 and the plurality of gate lines GL1 to GLn may extend in a second direction d2 intersecting the first direction d1 on the lower display plate 10. Referring to FIG. 1, the first direction d1 is a row direction and the second direction is a column direction. Each of the plurality of pixel units may receive a data signal from one of the plurality of data lines DL1 to DLm in response to the gate signal provided from one of the plurality of gate lines GL1 to GLn connected to the pixel units.

The data driving circuit 120 may include, as an exemplary embodiment, a shift register, a latch, a digital-analog converter ("DAC"), and the like. The data driving circuit 120 may receive a first control signal CONT1 and image data DATA from the timing control unit 140. The data driving circuit 120 may select a reference voltage in response to the first control signal CONT1, and convert the input image data DATA of a digital waveform into a plurality of data voltages D1 to Dm according to the selected reference voltage. The data driving circuit 120 may provide the generated plurality of data voltages D1 to Dm to the display panel 110.

The gate driving circuit 130 may receive a second control signal CONT2 from the timing control unit 140. The gate driving circuit 130 may provide the plurality of gate signals G1 to Gn to the display panel 110 according to the received second control signal CONT2.

The timing control unit 140 may receive, as an input, image signals R, G and B and a control signal thereof CS from an external source. The control signal CS may include, as an exemplary embodiment, a vertical synchronous signal, a horizontal synchronous signal, a main clock signal, a data enable signal and the like. The timing control unit 140 may process signals provided from an external source such that the signals are suitable for an operation condition of the display panel 110, and then generate the image data DATA, the first control signal CONT1 and the second control signal CONT2. The first control signal CONT1 may include a horizontal synchronization start signal for instructing start of an input of the image data DATA, a load signal for controlling an application of the plurality of data signals D1 to Dm to the plurality of data lines DL1 to DLm, and the like. The second control signal CONT2 may include a scan start signal for instructing a start of an output of the plurality of scan signals S1 to Sn, a gate clock signal for controlling the output timing of a scan-on-pulse, and the like.

The LCD device according to an exemplary embodiment of the invention may further include a power supply unit (not shown in the drawings). The power supply unit may supply operating power to the display device according to an exemplary embodiment of the invention, and supply a common voltage to a common electrode Vcom (refer to FIG. 2) through a common line (not shown in the drawings). As an exemplary embodiment, the common electrode 310 may be disposed on the upper substrate 20, but the invention is not limited thereto.

Figure 2:
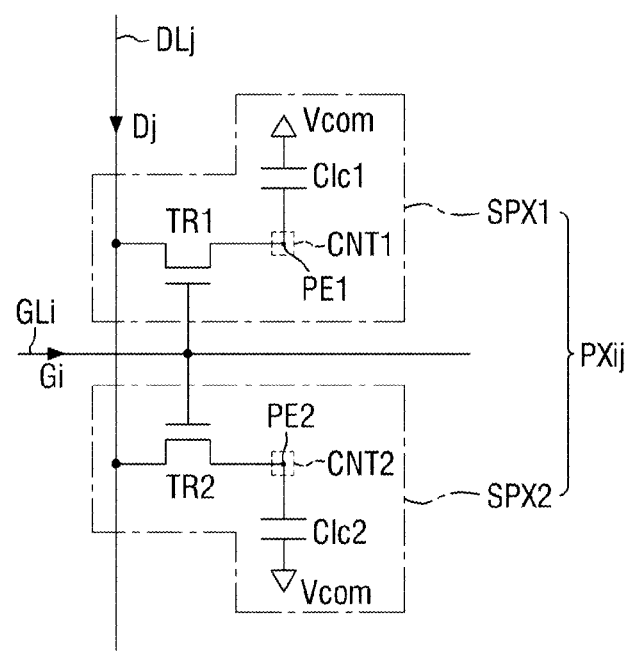
FIG. 2 is an equivalent circuit diagram of the pixel unit shown in FIG. 1 according to an exemplary embodiment of the invention.

FIG. 2 is an equivalent circuit diagram of the pixel unit PXij shown in FIG. 1. The pixel unit PXij connected to the jth data line (wherein, j is a natural number of 1 or larger) and the ith gate line (wherein, i is a natural number of 1 or larger) will hereinafter be described as an example among the plurality of pixel units.

The pixel unit PXij may include first and second subpixel units SPX1 and SPX2. The first and second subpixel units SPX1 and SPX2 may receive a jth data signal Dj provided thereto so as to display images according to gamma curves different from each other or a same gamma curve. That is, the first and second subpixel units SPX1 and SPX2 may display images different in luminance for one data signal, thereby improving side visibility. The first and second subpixel units SPX1 and SPX2 may include respective areas same or different from each other.

The first subpixel unit SPX1 may include a first switching element TR1 and a first liquid crystal capacitor Clc1. The second subpixel unit SPX2 may include a second switching element TR2 and a second liquid crystal capacitor Clc2. As an exemplary embodiment, the first and second switching elements TR1 and TR2 may be a tri-terminal element such as a thin film transistor. The first and second switching elements TR1 and TR2 are hereinafter exemplified as being a thin film transistor.

Referring first to the first subpixel unit SPX1, the first switching element TR1 may include a gate electrode connected to the ith gate line GLi, one electrode connected to the jth data line DLj and the other electrode connected to one electrode of the first liquid crystal capacitor Clc1. One electrode of the first switching element TR1 may be a source electrode as an exemplary embodiment, and the other electrode of the first switching element TR1 may be a drain electrode as an exemplary embodiment. The first liquid crystal capacitor Clc1 may be disposed between a first subpixel electrode PE1 connected to the other electrode of the first switching element TR1 and the common electrode Vcom. The first subpixel electrode PE1 may be connected to the other electrode of the first switching element TR1 through the first contact hole CNT1. This will be described later with reference to FIG. 4.

The first switching element TR1 may be turned on in response to an ith gate signal Gi provided from the ith gate line GLi so as to provide the jth data signal Dj provided from jth data line DLj to one electrode of the first liquid crystal capacitor Clc1, that is, the first subpixel electrode PE1. Thus, the first liquid crystal capacitor Clc1 may be charged with a voltage as much as the voltage difference between the voltage applied to the first subpixel electrode PE1 and the common voltage applied to the common electrode Vcom.

The second subpixel unit SPX2 will now be described. The second switching element TR2 may include a gate electrode connected to the ith gate line GLi, one electrode connected to the jth data line DLj and the other electrode connected to one electrode of the second liquid crystal capacitor Clc2. One electrode of the second switching element TR2 may be a source electrode as an exemplary embodiment, and the other electrode of the second switching element TR2 may be a drain electrode as an exemplary embodiment. The second liquid crystal capacitor Clc2 may be disposed between a second subpixel electrode PE2 connected to the other electrode of the second switching element TR2 and the common electrode Vcom. The second subpixel electrode PE2 may be connected to the other electrode of the second switching element TR2 through the second contact hole CNT2. This will be described later with reference to FIG. 4.

The second switching element TR2 may be turned on in response to the ith gate signal Gi provided from the ith gate line GLi so as to provide the jth data signal Dj provided from the jth data line DLj to one electrode of the second liquid crystal capacitor C1c2, that is, the second subpixel electrode PE2. Thus, the second liquid crystal capacitor C1c2 may be charged with a voltage as much as the voltage difference between the voltage applied to the second subpixel electrode PE2 and the common voltage applied to the common electrode Vcom.

That is, the first and second subpixel units SPX1 and SPX2 may receive the same gate signal Gi such that the first and second switching elements TR1 and TR2 may be respectively turned on, and thus the same data signal Dj may be applied to each of the first and second subpixel electrodes PE1 and PE2.

However, the LCD device according to an exemplary embodiment of the invention may include the first switching element TR1 of which on-resistance value is lower than on-resistance value of the second switching element TR2. Thus, although when the first and second switching elements TR1 and TR2 may be simultaneously turned on so as to receive data signals of the same voltage level from the jth data line DLj, the level of the voltage applied to the second subpixel electrode PE2 may be higher than the level of the voltage applied to the first subpixel electrode PE1 since on-resistance value of the second switching element TR2 is higher than on-resistance value of the first switching element TR1.

That is, voltages having different levels may be applied to the respective subpixel electrodes in the pixel unit PXij connected to each of the ith gate line GLi and the jth data line DLj, thereby enabling liquid crystal molecules of the first and second subpixel units SPX1 and SPX2 to tilt at different angles. Thus, the LCD device according to an exemplary embodiment of the invention may have improved visibility because of the difference in luminance between the subpixel units.

The LCD device according to an exemplary embodiment of the invention eliminates the necessity of forming a separate switching element for voltage division, and thus eliminates the necessity of defining a contact hole for applying voltages to a separate switching element. The LCD device according to an exemplary embodiment of the invention eliminates the necessity of forming a separate switching element for voltage division and a contact hole connected to the separate switching element, thereby providing an advantage in terms of aperture ratio. This will be explained with reference to FIG. 3 to FIG. 5.

Figure 3:
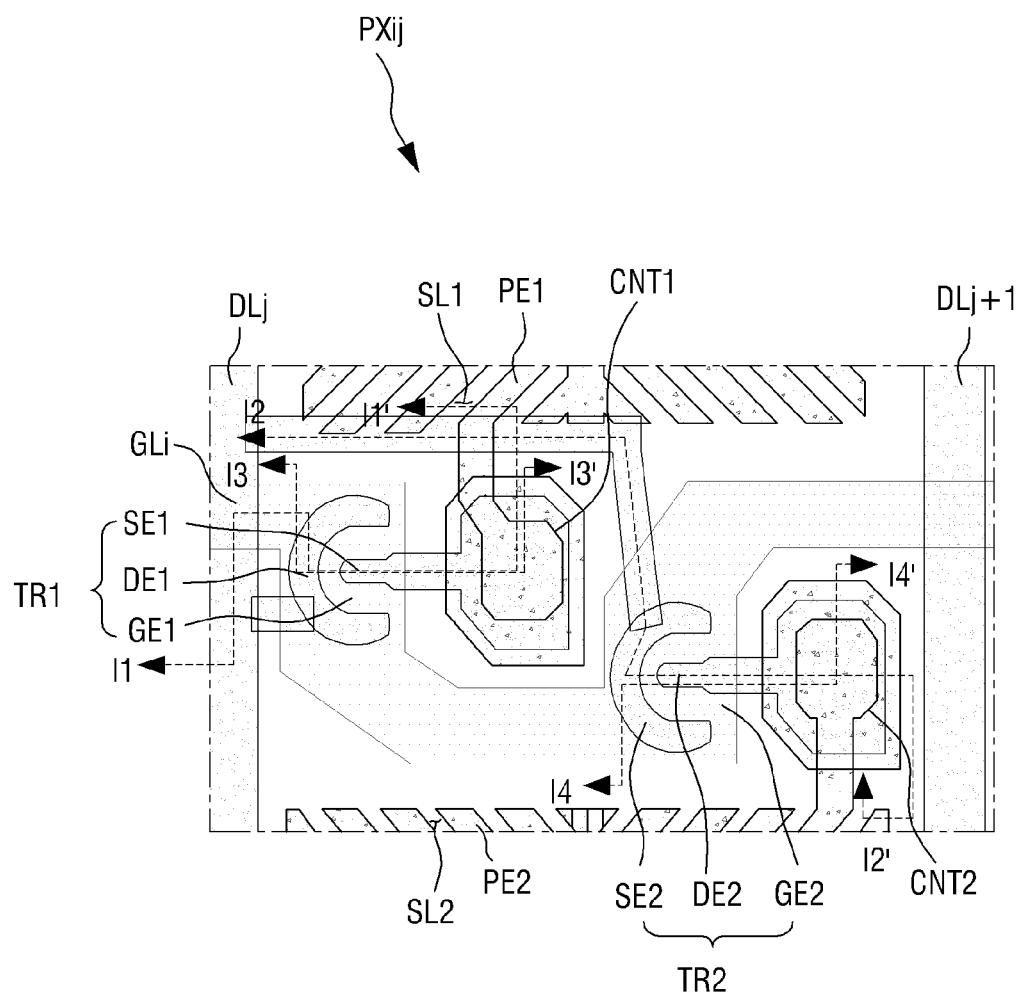
FIG. 3 is a plan view of the pixel unit shown in FIG. 2 according to an exemplary embodiment of the invention.
Figure 4:
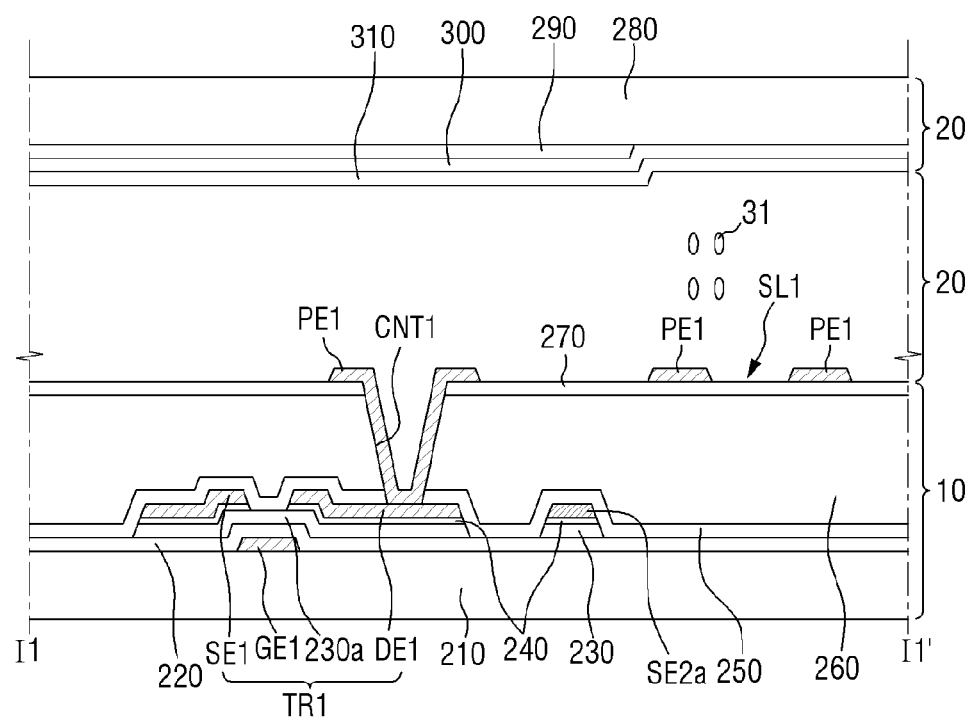
FIG. 4 is a cross sectional view taken along line I1-I1' of FIG. 3.
Figure 5:
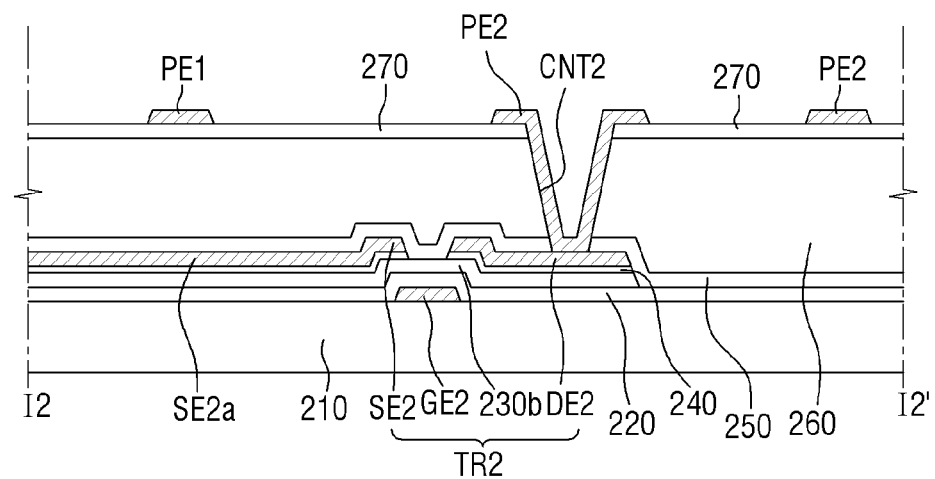
FIG. 5 is a cross sectional view taken along line I2-I2' of FIG. 3.

FIG. 3 is a plan view of the pixel unit PXij shown in FIG. 2 according to an exemplary embodiment of the invention. FIG. 4 is a cross sectional view taken along line I1-I1' of FIG. 3. FIG. 5 is a cross sectional view taken along line I2-I2' of FIG. 3.

Referring to FIG. 3 to FIG. 5, the LCD device according to an exemplary embodiment of the invention may include the lower display plate 10, the upper display plate 20 and the liquid crystal layer 30 interposed therebetween. The lower display plate 10 may be disposed to face the upper display plate 20. As an exemplary embodiment, the lower display plate 10 may be attached to the upper display plate 20 through sealing.

The lower display plate 10 will now be described.

The lower substrate 210 may be, as an exemplary embodiment, a transparent glass substrate, a plastic substrate or the like, and may be an array substrate on which a plurality of switching elements are disposed. The ith gate line GLi including first and second gate electrodes GE1 and GE2 may be disposed on the lower substrate 210.

The first gate electrode GE1 may protrude or extend toward a first semiconductor pattern 230a from the ith gate line GLi, and the second gate electrode GE2 may protrude or extend toward a second semiconductor pattern 230b from the ith gate line GLi. In an exemplary embodiment, the ith gate line GLi, the first gate electrode GE1 and the second gate electrode GE2 may include a single layer, a double layer including at least two, or a triple layer including at least three of conductive metals including aluminum (Al), copper (Cu), molybdenum (Mo), chrome (Cr), titanium (Ti), tungsten (W), moly-tungsten (MoW), moly-titanium (MoTi) and copper/moly-titanium (Cu/MoTi).

A gate insulation layer 220 may be disposed on the ith gate line GLi and the first and second gate electrodes GE1 and GE2. As an exemplary embodiment, the gate insulation layer 220 may include silicon nitride (SiNx), silicon oxide (SiOx) or the like. The gate insulation layer 220 may have a multi-layer structure including at least two insulation layers having different physical properties.

A semiconductor layer 230 may be disposed on the gate insulation layer 220, and as an exemplary embodiment, may include amorphous silicon, polycrystalline silicon or the like. The semiconductor layer 230 may be disposed to be at least partially overlapping the jth data line DLj. Furthermore, as an exemplary embodiment, when a plurality of data lines, first and second source electrodes SE1 and SE2, first and second drain electrodes DE1 and DE2 and the semiconductor layer 230 are provided together through a single mask process, the semiconductor layer 230 may be provided beneath those components. That is, the semiconductor layer 230 may have a shape substantially the same as those of the plurality of data lines, except in a channel region thereof. The semiconductor layer 230 may include the first semiconductor pattern 230a which provides the first switching element TR1 and the second semiconductor pattern 230b which provides the second switching element TR2. The first semiconductor pattern 230a may be disposed to be at least partially overlapping the first gate electrode GE1, and the second semiconductor pattern 230b may be disposed to be at least partially overlapping the second gate electrode GE2.

The second semiconductor pattern 230b may have a resistance value higher than that of the first semiconductor pattern 230a. Thus, on-resistance value of the second switching element TR2 may be higher than on-resistance value of the first switching element TR1. This will be described later.

An ohmic contact layer 240 may be disposed on the semiconductor layer 230. In an exemplary embodiment, the ohmic contact layer 240 may include n+ hydrated amorphous silicon or the like, which is highly doped with n-type impurities such as phosphorus, or including silicide.

The jth data line DLj, the first source electrode SE1, the second source electrode SE2, the first drain electrode DE1 and the second drain electrode DE2 may be disposed on the ohmic contact layer 240. That is, the jth data line DLj may be disposed in the same layer as the first source electrode SE1, the second source electrode SE2, the first drain electrode DE1 and the second drain electrode DE2, and may be connected to each of the first source electrode SE1 and the second source electrode SE2. The first drain electrode DE1 may be electrically connected to the first subpixel electrode PE1 through the first contact hole CNT1. The second drain electrode DE2 may be electrically connected to the second subpixel electrode PE2 through the second contact hole CNT2.

In an exemplary embodiment, the jth data line DLj, the first source electrode SE1, the second source electrode SE2, the first drain electrode DE1 and the second drain electrode DE2 may include a single layer, a double layer including at least two, or a triple layer including at least three of conductive metals including aluminum (Al), copper (Cu), molybdenum (Mo), chrome (Cr), titanium (Ti), tungsten (W), moly-tungsten (MoW), moly-titanium (MoTi) and copper/moly-titanium (Cu/MoTi). However, the invention is not limited thereto, and those components may include various metals or conductors.

The first source electrode SE1 and the first drain electrode DE1 may be disposed to at least partially overlap the first gate electrode GE1, and spaced apart from each other by a predetermined distance in the same layer. The second source electrode SE2 and the second drain electrode DE2 may be disposed to at least partially overlap the second gate electrode GE2, and spaced apart from each other by a predetermined distance in the same layer.

Thus, the first gate electrode GE1, the first semiconductor pattern 230a, the first source electrode SE1 and the first drain electrode DE1 may form the first switching element TR1, and the second gate electrode GE2, the second semiconductor pattern 230b, the second source electrode SE2 and the second drain electrode DE2 may form the second switching element TR2. That is, the first switching element TR1 may receive the ith gate signal Gi so as to be turned on to receive the jth data signal Dj from the jth data line DLj through the first source electrode SE1, and provide the jth data signal Dj to the first subpixel electrode PE1 through the first drain electrode DE1 and the first contact hole CNT1 connected to the first drain electrode DE1. Similarly, the second switching element TR2 may receive the ith gate signal Gi so as to be turned on to receive the jth data signal Dj from the jth data line DLj through the second source electrode SE2 connected to a second source electrode extension SE2a, and provide the jth data signal Dj to the second subpixel electrode PE2 through the second drain electrode DE2 and the second contact hole CNT2 connected to the second drain electrode DE2.

However, since the resistance value of the first semiconductor pattern 230a may be lower than the resistance value of the second semiconductor pattern 230b, the level of the voltage applied to the second subpixel electrode PE2 may be higher than the level of the voltage applied to the first subpixel electrode PE1 even when the same jth data signal Dj is provided through the first and second source electrodes SE1 and SE2. Thus, liquid crystal molecules of the first and second subpixel units SPX1 and SPX2 may tilt at different angles, thereby enabling the LCD device according to an exemplary embodiment of the invention to have improved visibility because of the difference in luminance between the subpixel units.

A first passivation layer 250 may be disposed on the gate insulation layer 220 in addition to the jth data line DLj, the first source electrode SE1, the second source electrode SE2, the first drain electrode DE1 and the second drain electrode DE2. The first passivation layer 250 may include an inorganic insulation material such as silicon nitride, silicon oxide or the like. The first passivation layer 250 may prevent a pigment of a color filter 260 disposed on the first passivation layer 250 from being introduced into an exposed semiconductor portion.

The color filter 260 may be disposed on the first passivation layer 250. In an exemplary embodiment, the color filter 260 may display one of primary colors such as a red color, a green color and a blue color, for example, but the invention is not limited thereto. The color filter 260 may include a material displaying different colors for every adjacent pixel.

A second passivation layer 270 may be disposed on the color filter 260. In an exemplary embodiment, the second passivation layer 270 may include an inorganic insulation material such as silicon nitride, silicon oxide or the like, or an organic insulation material. The second passivation layer 270 may prevent an upper portion of the color filter 260 from being lifted up and inhibit the liquid crystal layer 30 from being contaminated by an organic material such as a solvent introduced from the color filter 260, thereby preventing defects such as afterimage which might be otherwise caused in driving a screen.

The first subpixel electrode PE1 may be disposed on the second passivation layer 270 and electrically connected to the first drain electrode DE1 exposed through the first contact hole CNT1. The second subpixel electrode PE2 may be disposed on the second passivation layer 270 and electrically connected to the second drain electrode DE2 exposed through the second contact hole CNT2. In an exemplary embodiment, the first and second subpixel electrodes PE1 and PE2 may include a transparent conductive material such as indium tin oxide ("ITO"), indium zinc oxide ("IZO") or the like, or reflective metal such as aluminum, silver, chrome, an alloy thereof or the like.

As an exemplary embodiment, a plurality of first slits SL1 may be defined in the first subpixel electrode PE1, and as an exemplary embodiment, a plurality of second slits SL2 may be defined in the second subpixel electrode PE2. As for the first subpixel electrode PE1, the first slits may generate a fringe field between the first subpixel electrode PE1 and the common electrode 310, which will be described later, so as to enable a plurality of liquid crystal molecules 31 to rotate in a specific direction. As an exemplary embodiment, the first and second subpixel electrodes PE1 and PE2 may have an overall square shape, and include a cross-shaped stem including a plurality of horizontal stem parts and a plurality of vertical stem parts intersecting the horizontal stem parts.

Although not shown in the drawings, the LCD device according to an exemplary embodiment of the invention may include a shield electrode (not shown) disposed on a plurality of data lines including the jth data line DLj. The shield electrode may be disposed in the same layer as the first and second subpixel electrode PE1 and PE2, that is, on the second passivation layer 270. The shield electrode may receive voltage applied thereto same as the voltage applied to the common electrode 310, and may be disposed to overlap the plurality of data lines, thereby preventing light leakage caused by coupling between pixel electrodes adjacent to the plurality of data lines. As an exemplary embodiment, the shield electrode may include a transparent conductive material such as ITO, IZO or the like, or reflective metal such as aluminum, silver, chrome, an alloy thereof or the like.

The upper display plate 20 will now be described.

In an exemplary embodiment, an upper substrate 280 may include black glass, plastic or the like. A light blocking member 290, also referred to as a black matrix, for preventing light leakage may be disposed on the upper substrate 280. An overcoat layer 300 may be disposed on the upper substrate 280 and the light blocking member 290. In an exemplary embodiment, the overcoat layer 280 may include an insulation material, and omitted in some cases.

The common electrode 310 may be disposed on the overcoat layer 300. The common electrode 310 may be disposed to at least partially overlap the first and second subpixel electrodes PE1 and PE2. When the jth data signal Dj is applied to the first subpixel electrode PE1 by a switching operation of the first switching element TR1 and a common voltage is applied to the common electrode 310, an electric field may be generated between the first subpixel electrode PE1 and the common electrode 310, and the plurality of liquid crystal molecules 31 may be aligned according to the generated electric field. Similarly, an electric field may also be generated between the second subpixel electrode PE2 and the common electrode 310. However, as described above, since the level of the voltage applied to the second subpixel electrode PE2 is lower than the level of the voltage applied to the first subpixel electrode PE1, the plurality of liquid crystal molecules between the second subpixel electrode PE2 and the common electrode 310 and the plurality of liquid crystal molecules between the first subpixel electrode PE1 and the common electrode 310 may be in different aligned states. Thus, the LCD device according to an exemplary embodiment of the invention may enable the magnitude of the voltage applied to the first subpixel electrode PE1 to be different from the magnitude of the voltage applied to the second subpixel electrode PE2, thereby improving side visibility without having a separate transistor for voltage division and a contact hole connected to the transistor.

Figure 6:
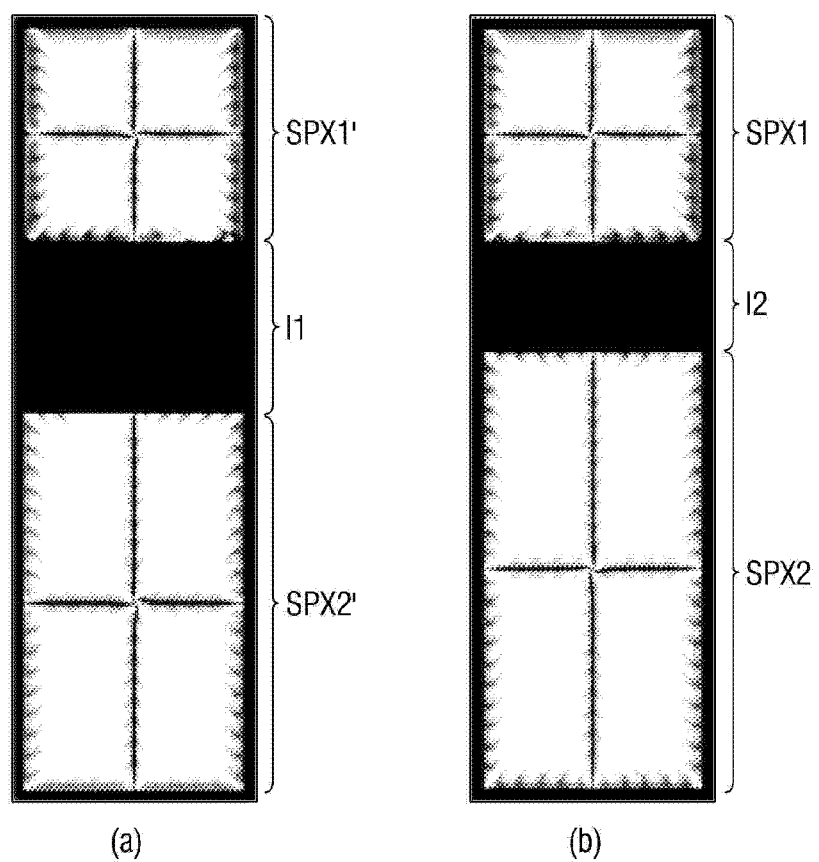
FIGS. 6 to 8 illustrate effects of the LCD device according to an exemplary embodiment of the invention.
Figure 7:
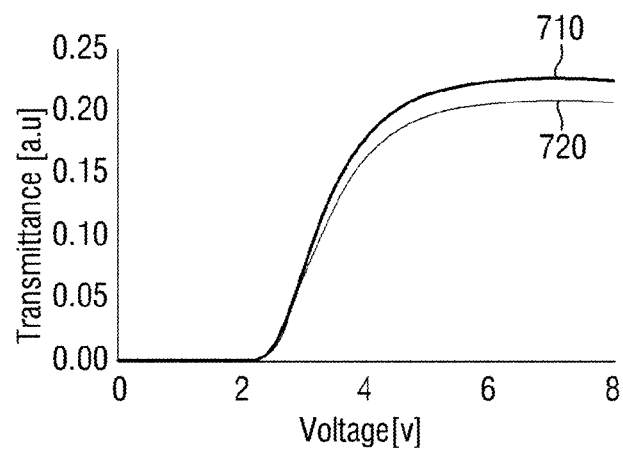
Figure 8:
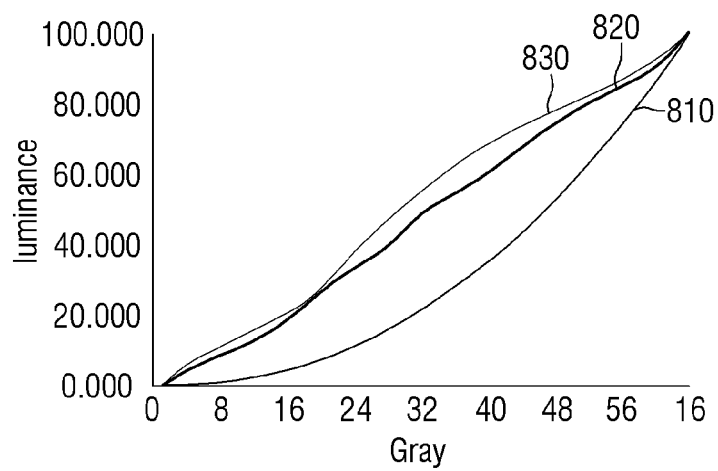
Figure 9:
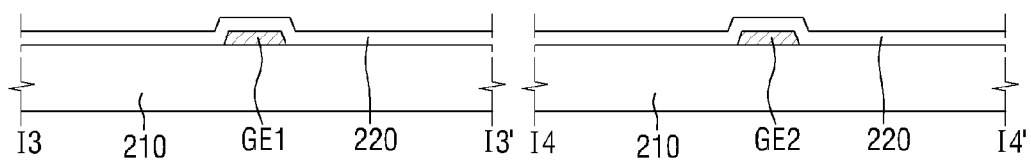
FIGS. 9 to 14 illustrate a method for manufacturing the LCD device according to an exemplary embodiment of the invention.

FIG. 6 to FIG. 8 illustrate effects of the LCD device according to an exemplary embodiment of the invention.

FIG. 6 (a) illustrates an LCD device according to prior art, that is, an LCD device provided with a separate transistor for voltage division and a contact hole connected to the transistor, and FIG. 6 (b) illustrates the LCD device according to an exemplary embodiment of the invention.

Referring to FIG. 6, a first subpixel unit SPX1' shown in (a) and a first subpixel unit SPX1 shown in (b) may have substantially the same length but a second subpixel unit SPX2' shown in (a) and a second subpixel unit SPX2 shown in (b) may have different lengths. This is because the LCD device according to an exemplary embodiment of the invention does not include a separate transistor for voltage division and a contact hole connected to the transistor is not defined in the LCD device. Thus, a distance l2 between the first subpixel unit SPX1 and the second subpixel unit SPX2 shown in (b) may be shorter than a distance l1 between the first subpixel unit SPX1' and the second subpixel unit SPX2' shown in (a). Thus, the LCD device according to an exemplary embodiment of the invention may have a relatively large number of regions through which light transmits, thereby achieving high aperture ratio and improved transmittance.

Referring to FIG. 7, the maximum transmittance of the LCD device according to an exemplary embodiment of the invention (710) has been improved by approximately 8.7% as compared with the maximum transmittance of the LCD device of prior art (720).

FIG. 8 is a graphical representation illustrating a front gamma curve of the LCD device 810, a side gamma curve of the LCD device according to the exemplary embodiment of the invention 820, and a side gamma curve of the LCD device of prior art 830. Referring to FIG. 8, in the case of the side gamma curve of the LCD device according to the exemplary embodiment of the invention 820 may be seen that the closer the front gamma curve 810 of the LCD device, compared to the prior art 830.

More specifically, the side gamma curve of the LCD device according to the exemplary embodiment of the invention 820 may have a visibility index ("GDI") lower than that of the side gamma curve of the LCD device of prior art 820 at the same tone (for example, gray). In an exemplary embodiment, when the visibility index of the side gamma curve of the LCD device of prior art is 0.303, the visibility index of the side gamma curve of the LCD device according to the exemplary embodiment of the invention may be 0.265. That is, the LCD device according to an exemplary embodiment of the invention may have a side visibility index lower than that of prior art, thereby improving visibility.

FIG. 9 to FIG. 14 illustrate a method for manufacturing the LCD device according to an exemplary embodiment of the invention. FIG. 9 to FIG. 14 illustrate a method for manufacturing a first switching element TR1 with reference to the cross sectional view taken along line I3-I3' of FIG. 3, and a method for manufacturing a second switching element TR2 with reference to the cross sectional view taken along line I4-I4' of FIG. 3.

Referring to FIG. 3 to FIG. 5 and FIG. 9, the ith gate line GLi may be disposed on a lower substrate 210. The ith gate line GLi may further include the first and second gate electrodes GE1 and GE2. More specifically, a gate conductive layer may be disposed on the lower substrate 210 and etched by using a photosensitive film pattern, thereby forming the ith gate line GLi including the first and second gate electrodes GE1 and GE2. In an exemplary embodiment, the gate conductive layer may include a single layer, a double layer including at least two, or a triple layer including at least three of conductive metals including aluminum (Al), copper (Cu), molybdenum (Mo), chrome (Cr), titanium (Ti), tungsten (W), moly-tungsten (MoW), moly-titanium (MoTi) and copper/moly-titanium (Cu/MoTi). However, the invention is not limited thereto, and the gate conductive layer may include various metals or conductors.

Subsequently, the conductive film pattern (not shown in the drawings) may be removed, and the gate insulation layer 220 may be disposed on the first gate electrode GE1, the second gate electrode GE2 and the ith gate line GLi (refer to FIG. 3). As an exemplary embodiment, the gate insulation layer 220 may be provided by a chemical vapor deposition. The gate insulation layer 220 may be disposed on the whole surface of the lower substrate 210 on which the first gate electrode GE1, the second gate electrode GE2 and the ith gate line GLi are disposed.

Figure 10:
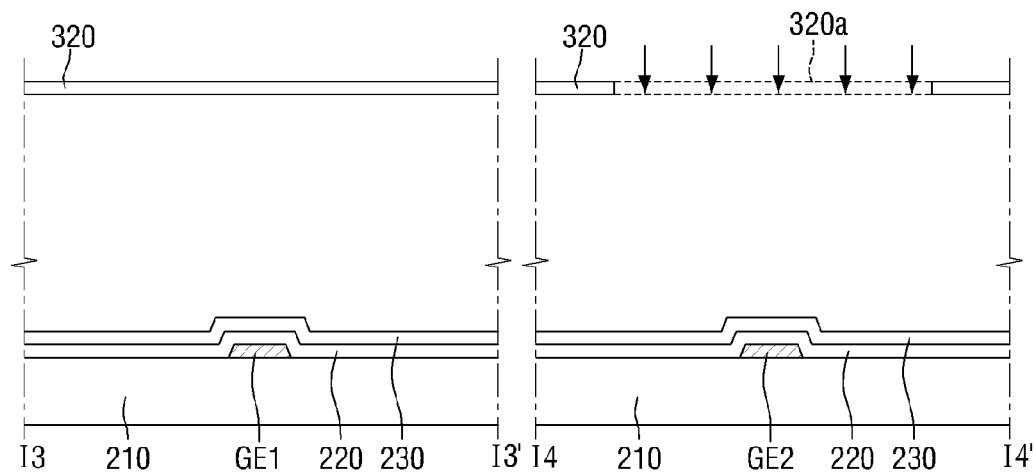

Referring to FIG. 10, the semiconductor layer 230 may first be disposed on the first gate electrode GE1, the second gate electrode GE2 and the gate insulation layer 220. However, for detailed description, the semiconductor layer prior to light irradiation will be designated as reference numeral 230, and the semiconductor layer after light irradiation will be designated as 231.

In an exemplary embodiment, the semiconductor layer 230 may be provided by depositing amorphous silicon, polycrystalline silicon or the like through a chemical vapor deposition, for example. Then, light can be irradiated by using a mask 320 only to a portion in which the second semiconductor pattern 230b is disposed. That is, slits for preventing light from being irradiated to the portion except the second semiconductor pattern 230b portion of the semiconductor layer 230 and allowing light to be irradiated to the second semiconductor pattern 230b portion of the semiconductor layer 230 may be defined in the mask 320. As an exemplary embodiment, the mask 320 may be a half-tone mask or a slit mask.

Thus, in the LCD device according to an exemplary embodiment of the invention, a region corresponding to the second semiconductor pattern 230b forming the second switching element TR2 may be selectively exposed to light so as to form the semiconductor layer 231 including the region corresponding to the second semiconductor pattern 230b, in which a resistance component of amorphous silicon or polycrystalline silicon is increased. That is, dangling bonds may be removed by light in the region corresponding to the second semiconductor pattern 230b so as to change resistance characteristics therein, more specifically, the resistance component may be increased more in the region corresponding to the second semiconductor pattern 230b than in other regions. On the contrary, light may not be irradiated to the region corresponding to the first semiconductor pattern 230a, causing no change in resistance characteristics. Thus, the semiconductor layer 231 may include the region corresponding to the first semiconductor pattern 230a and the region corresponding to the second semiconductor pattern 230b. The two regions may have resistance components different from each other.

Then, an ohmic contact layer 241 and a first data conductor S/D_1 may be disposed on the semiconductor layer 231. In an exemplary embodiment, the ohmic contact layer 241 may include n+ hydrated amorphous silicon or the like, which is highly doped with n-type impurities such as phosphorus, or including silicide. In an exemplary embodiment, the first data conductor S/D_1 may include a single layer, a double layer including at least two, or a triple layer including at least three of conductive metals including aluminum (Al), copper (Cu), molybdenum (Mo), chrome (Cr), titanium (Ti), tungsten (W), moly-tungsten (MoW), moly-titanium (MoTi) and copper/moly-titanium (Cu/MoTi).

Figure 11:
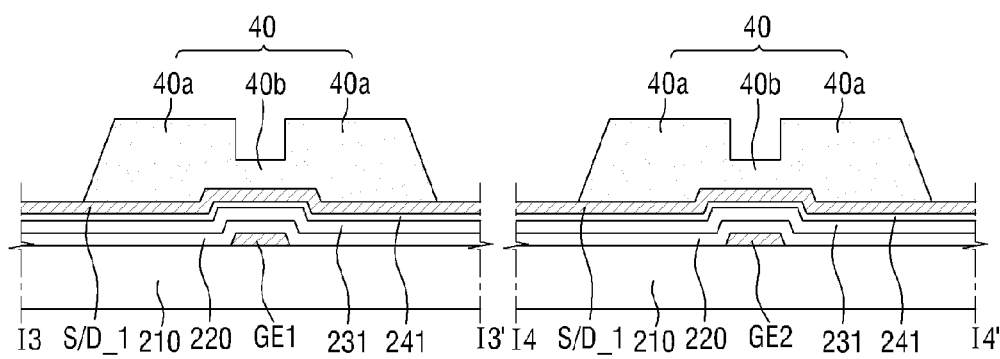

Referring next to FIG. 11, a photosensitive film is disposed on the first data conductor S/D_1, and then exposed and developed by using a half-tone mask (not shown in the drawing) or a slit mask, thereby forming a first photosensitive film pattern 40. The first photosensitive film pattern 40 may include a first region 40a having a first thickness and a second region 40b having a second thickness thinner than the first thickness. The first region 40a may be provided in a portion where data wiring main remain, and the second region 40b may be provided in a portion corresponding to the channel region of the first and second switching elements TR1 and TR2 (refer to FIG. 3).

Figure 12:
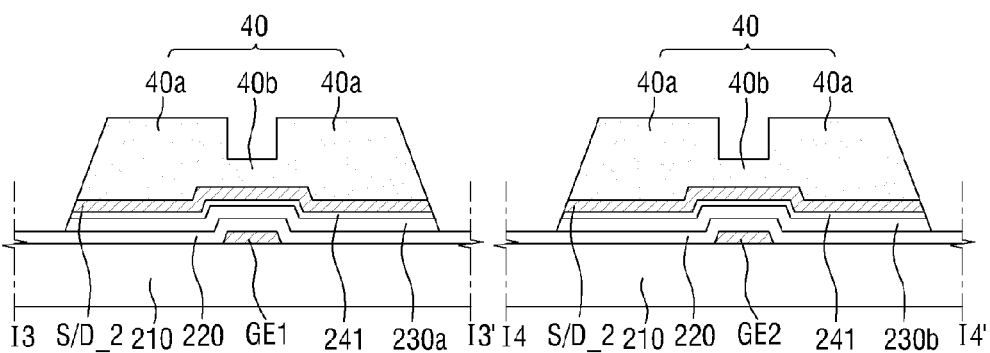

Referring to FIG. 12, the exposed first data conductor S/D_1 may be etched by using the first photosensitive film pattern 40 as a mask, thereby forming a second data conductor S/D_2. In an exemplary embodiment, the first data conductor S/D_1 may be, for example, wet etched. A pattern of a data line may be provided through the etching process. Subsequently, the ohmic contact layer 241 may be etched by using the first photosensitive film pattern 40 as a mask so as to form the ohmic contact layer 240, and the semiconductor layer 231 may be etched to form the first and second semiconductor patterns 230a and 230b. In an exemplary embodiment, the etching process may be, for example, a drying etching process.

The gate insulation layer 220 may be exposed through the two etching processes described above. One side of the second data conductor S/D_2, one side of the first semiconductor pattern 230a and one side of the second semiconductor pattern 230b may substantially overlap each other through the etching processes described above. Similarly, the other side of the second data conductor S/D_2, the other side of the first semiconductor pattern 230a and the other side of the second semiconductor pattern 230b may substantially overlap each other.

Figure 13:
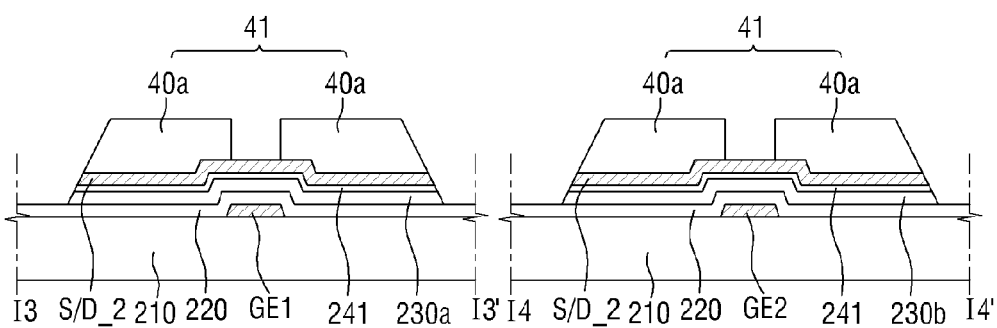

Referring next to FIG. 13, the overall thickness of the first photosensitive film pattern 40 may be reduced to form a second photosensitive film pattern 41 where the second region 40b is removed. Resultantly, the second data conductor S/D_2 may be exposed in the portion corresponding to the channel region. In an exemplary embodiment, the second photosensitive film pattern 41 may be provided through an etchback process, an ashing process or the like.

Figure 14:
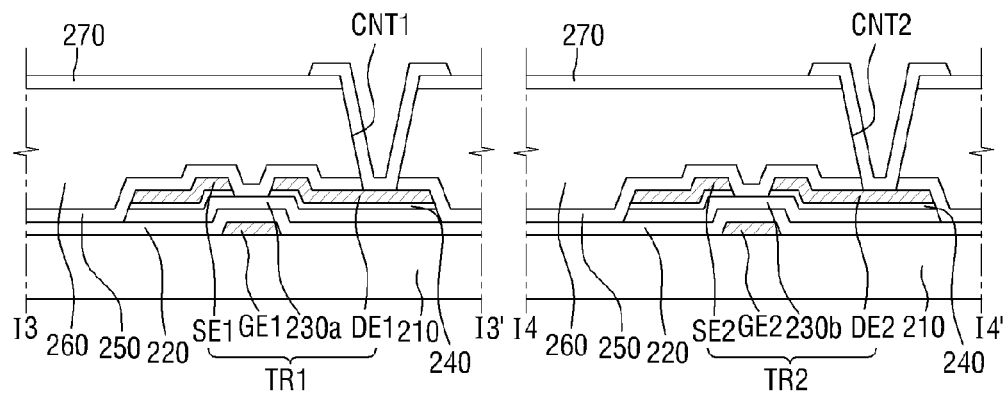

Referring to FIG. 13 and FIG. 14, the exposed second data conductor S/D_2 may be etched by using the second photosensitive film pattern 41 as a mask. Thus, the first source electrode SE1 and the first drain electrode DE1 may be disposed to be spaced apart from each other. Furthermore, the second source electrode SE2 and the second drain electrode DE2 may be disposed to be spaced apart from each other.

Then, the first passivation layer 250, the color filter 260 and the second passivation layer 270 may be sequentially disposed on the first semiconductor pattern 230a, the second semiconductor pattern 230b, the gate insulation layer 220, the first source electrode SE1, the second source electrode SE1, the first drain electrode DE1 and the second drain electrode DE2.

Subsequently, the first contact hole CNT1 may be defined to be connected to the exposed first drain electrode DE1 and the second contact hole CNT2 may be defined to be connected to the exposed second drain electrode DE2. In an exemplary embodiment, the first and second subpixel electrodes PE1 and PE2 including ITO or IZO may be disposed on the second passivation layer 270.

The LCD device according to an exemplary embodiment of the invention may include the first and second subpixel units SPX1 and SPX2 (refer to FIG. 2) in one pixel unit thereof, the first and second subpixel units SPX1 and SPX2 including respective switching elements with respective on-resistance values different from each other, thus enabling voltages of different levels to be applied to the respective subpixel electrodes even when the same data signal is applied to the subpixel electrodes. Resultantly, liquid crystal molecules in the first and second subpixel units SPX1 and SPX2 may tilt at different angles, thereby enabling the LCD device according to an exemplary embodiment of the invention to have improved visibility because of the difference in luminance between the subpixel units.

As described above, each of the first and second subpixel units SPX1 and SPX2 may include one switching element, and the contact hole connected to the switching element may be defined in the first and second subpixel units SPX1 and SPX2, but each of the first and second subpixel units SPX1 and SPX2 may not include a separate transistor for voltage division, and a contact hole connected to the transistor may not be defined. Thus, the LCD device according to an exemplary embodiment of the invention may have a relatively improved aperture ratio and resultantly improved transmittance.

Although certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:
1. A liquid crystal display device comprising:
   a data driving unit connected to a first data line disposed in a first direction;
   a gate driving unit connected to a first gate line disposed in a second direction different from the first direction;
   a semiconductor layer including a first semiconductor layer pattern and a second semiconductor layer pattern;

a first subpixel unit including a first switching element, a first gate electrode of which is connected to the first gate line, one electrode of which is connected to the first data line, the other electrode of which is connected to a first subpixel electrode and corresponds to the first semiconductor layer pattern; and a second subpixel unit including a second switching element, a second gate electrode of which is connected to the first gate line, one electrode of which is connected to the first data line, the other electrode of which is connected to a second subpixel electrode and corresponds to the second semiconductor layer pattern, wherein a resistance value of the second semiconductor layer pattern of the second switching element is larger than a resistance value of the first semiconductor layer pattern of the first switching element wherein each of the first subpixel unit and the second subpixel unit only comprises one transistor selected from the first switching element and the second switching element, wherein the first semiconductor layer pattern includes amorphous silicon including dangling bonds, and wherein the second semiconductor layer pattern includes amorphous silicon which does not include dangling bonds.

2. The liquid crystal display device of claim 1, wherein, when the first and second switching elements are turned on, a ratio of a level of a voltage applied to the first subpixel electrode to a level of a voltage applied to the second subpixel electrode is 1:0.63 to 0.76.

3. The liquid crystal display device of claim 1, wherein, when the first and second switching elements are turned on, a level of a voltage applied to the first subpixel electrode is higher than a level of a voltage applied to the second subpixel electrode.

4. The liquid crystal display device of claim 1, wherein the first switching element includes a first semiconductor pattern including amorphous silicon or polycrystalline silicon, and the second switching element includes a second semiconductor pattern including amorphous silicon or polycrystalline silicon.

5. A liquid crystal display device comprising:
a first gate line disposed on a substrate;
a first data line disposed on the substrate so as to be insulated from the first gate line;
a first switching element including a first gate electrode connected to the first gate line, a first semiconductor pattern overlapping the first gate electrode, a first source electrode connected to the first data line, and a first drain electrode connected to a first subpixel electrode; and
a second switching element including a second gate electrode connected to the first gate line, a second semiconductor pattern overlapping the second gate electrode, a second source electrode connected to the first data line, and a second drain electrode connected to a second subpixel electrode,
wherein a resistance value of the second semiconductor pattern is higher than a resistance value of the first semiconductor pattern,
wherein each of the first subpixel unit and the second subpixel unit only comprises one transistor selected from the first switching element and the second switching element,
wherein the first semiconductor layer pattern includes amorphous silicon including dangling bonds, and wherein the second semiconductor layer pattern includes amorphous silicon which does not include dangling bonds.

6. The liquid crystal display device of claim 5, wherein an on-resistance value of the second switching element is larger than an on-resistance value of the first switching element.

7. The liquid crystal display device of claim 5, wherein, when the first and second switching elements are turned on, a ratio of a level of a voltage applied to the first subpixel electrode to a level of a voltage applied to the second subpixel electrode is 1:0.63 to 0.76.

8. The liquid crystal display device of claim 5, wherein the first and second semiconductor patterns include amorphous silicon or polycrystalline silicon.

9. The liquid crystal display device of claim 5, further comprising:
a gate insulation layer disposed on the first gate line, wherein
the semiconductor layer is disposed on the gate insulation layer,
the first source electrode and the first drain electrode are disposed on the first semiconductor pattern such that the first source electrode and the first drain electrode are spaced apart from each other and at least partially overlapping the first semiconductor pattern, and
the second source electrode and the second drain electrode are disposed on the second semiconductor pattern such that the second source electrode and the second drain electrode are spaced apart from each other and at least partially overlapping the second semiconductor pattern.

10. The liquid crystal display device of claim 9, further comprising:
a first insulation layer disposed on the first source electrode, the second source electrode, the first drain electrode and the second drain electrode;
a color filter disposed on the first insulation layer; and
a second insulation layer disposed on the color filter,
wherein the first and second subpixel electrodes are disposed on the second insulation layer.

11. The liquid crystal display device of claim 5, wherein, when the first and second switching elements are turned on, a level of a voltage applied to the first subpixel electrode is higher than a level of a voltage applied to the second subpixel electrode.

12. A method for manufacturing a liquid crystal display device which comprises a first subpixel including a first switching element, a first subpixel electrode and a first semiconductor pattern and a second subpixel including a second switching element, a second pixel electrode and a second semiconductor pattern, comprising:
providing a substrate on which a first gate line covered by a gate insulation layer is disposed;
forming the first switching element including a first gate electrode connected to the first gate line and the first semiconductor pattern disposed on the gate insulation layer, and the second switching element including a second gate electrode connected to the first gate line and the second semiconductor pattern disposed on the gate insulation layer; and
forming the first subpixel electrode connected to a first drain electrode of the first switching element, and the second subpixel electrode connected to a second drain electrode of the second switching element,
wherein the forming the first and second switching elements includes:

forming a semiconductor layer on the gate insulation layer;

irradiating light only to a region of the semiconductor layer corresponding to the second semiconductor pattern and not irradiating light to a region of the semiconductor layer corresponding to the first semiconductor pattern; and forming a first data conductor on the semiconductor layer, and forming the first and second semiconductor patterns and the first and second drain electrodes by using the first data conductor, wherein each of the first subpixel unit and the second subpixel unit only comprises one transistor selected from the first switching element and the second switching element, wherein the first semiconductor layer pattern includes amorphous silicon including dangling bonds, and wherein the second semiconductor layer pattern includes amorphous silicon which does not include dangling bonds.

13. The method of claim 12, wherein the forming the first and second semiconductor patterns and the first and second drain electrodes includes:

forming a first photosensitive film pattern including a first region and a second region having a thickness thinner than a thickness of the first region on the first data conductor;

etching the first data conductor by using the first photosensitive film pattern as a mask so as to form a second data conductor and the first and second semiconductor patterns;

removing the second region of the first photosensitive film pattern so as to form a second photosensitive film pattern for exposing a part of the second data conductor; and etching the exposed part of the second data conductor by using the second photosensitive film pattern as a mask so as to form the first and second drain electrodes.

14. The method of claim 12, wherein the irradiating the light includes irradiating the light through a mask having an aperture overlapping the region of the semiconductor layer corresponding to the second semiconductor pattern.

15. The method of claim 12, wherein a resistance value of the second semiconductor pattern is higher than a resistance value of the first semiconductor pattern.

16. The method of claim 12, wherein the first semiconductor pattern includes amorphous silicon or polycrystalline silicon, and the second semiconductor pattern includes amorphous silicon or polycrystalline silicon.

17. The method of claim 12, wherein, when the first and second switching elements are turned on, a ratio of a level of a voltage applied to the first subpixel electrode to a level of a voltage applied to the second subpixel electrode is 1:0.63 to 0.76.

18. The method of claim 12, wherein, when the first and second switching elements are turned on, a level of a voltage applied to the first subpixel electrode is higher than a level of a voltage applied to the second subpixel electrode.

19. The method of claim 12, further comprising:

forming a first insulation layer on the first and second drain electrodes;

forming a color filter on the first insulation layer; and forming a second insulation layer on the color filter, wherein the first and second subpixel electrodes are disposed on the second insulation layer.

20. The method of claim 12, wherein the first subpixel electrode is electrically connected to the first drain electrode through a first contact hole, and the second subpixel electrode is electrically connected to the second drain electrode through a second contact hole.

* * * * *